US012592774B1

(12) United States Patent (10) Patent No.: US 12,592,774 B1
Goban et al. (45) Date of Patent: Mar. 31, 2026

(54) ATOM TRANSPORT FOR NANOFIBER QUANTUM COMPUTING AND REPEATER AND METHOD

(71) Applicant: Nanofiber Quantum Technologies, Inc., Tokyo (JP)

(72) Inventors: Akihisa Goban, Tokyo (JP); Shinya Kato, Tokyo (JP); Ryotaro Inoue, Tokyo (JP); Hideki Konishi, Tokyo (JP); Takao Aoki, Tokyo (JP)

(73) Assignee: Nanofiber Quantum Technologies, Inc., Tokyo (JP)

( * ) Notice: Subject to any disclaimer, the term of this patent is extended or adjusted under 35 U.S.C. 154(b) by 321 days.

(21) Appl. No.: 18/349,750

(22) Filed: Jul. 10, 2023

(51) Int. Cl.
G21K 1/00 (2026.01)
H01S 5/00 (2006.01)
H04B 10/25 (2013.01)

(52) U.S. Cl.
CPC ............. *H04B 10/25* (2013.01); *G21K 1/006* (2013.01); *H01S 5/005* (2013.01)

(58) Field of Classification Search
CPC .......... G21K 1/006; H01S 5/005; H04B 10/25
See application file for complete search history.

(56) References Cited

U.S. PATENT DOCUMENTS

| | | | | |
|---|---|---|---|---|
| 10,504,033 B1 * | 12/2019 | King | ..................... | G06N 10/60 |
| 2020/0116623 A1 * | 4/2020 | Cooper-Roy | .......... | G06N 10/70 |
| 2021/0272006 A1 * | 9/2021 | King | ..................... | G06N 10/60 |

FOREIGN PATENT DOCUMENTS

| | | |
|---|---|---|
| JP | 2016153850 A | 8/2016 |
| JP | 2023055195 | 3/2020 |
| WO | 2022009950 A1 | 1/2022 |

OTHER PUBLICATIONS

Skelton, S. E., et al. "Evanescent wave optical trapping and transport of micro-and nanoparticles on tapered optical fibers." Journal of Quantitative Spectroscopy and Radiative Transfer 113.18 (2012): 2512-2520. (Year: 2012).*
Sayrin, Clément, et al. "Storage of fiber-guided light in a nanofiber-trapped ensemble of cold atoms." Optica 2.4 (2015): 353-356 (Year: 2015).*
C.-L. Hung et al. "Quantum spin dynamics with pairwise-tunable, long-range interactions", PNAS, 2016, E4946-E4955, 113 (34), www.pnas.org/cgi/doi/10.1073/pnas.1603777113.
L.-M. Duan et al. "Robust quantum gates on neutral atoms with cavity-assisted photon scattering", The American Physical Society, 2005, 032333-1-032333-4, 72, DOI: 10.1103/PhysRevA.72. 032333.
L.-M. Duan et al. "Scalable Photonic Quantum Computation through Cavity-Assisted Interactions", The American Physical Society, 2004, 127902-1-127902-4, DOI: 10.1103/PhysRevLett.92.127902.

* cited by examiner

*Primary Examiner* — Wyatt A Stoffa
(74) *Attorney, Agent, or Firm* — Richard T. Ogawa; Ogawa P.C.

(57) ABSTRACT

The invention includes a method and system using a counter propagating trapping tweezer array input. In an example, the system has a backside imaging system characterized by a numerical aperture of 0.05 and greater. In an example, the backside imaging system is configured to generate a counter-propagating optical tweezer array and/or a weakly focusing beam to interfere with the optical tweezer array to selectively transport at least one of the plurality of atoms that are evanescently coupled to a nanofiber region.

10 Claims, 5 Drawing Sheets

Figure 2

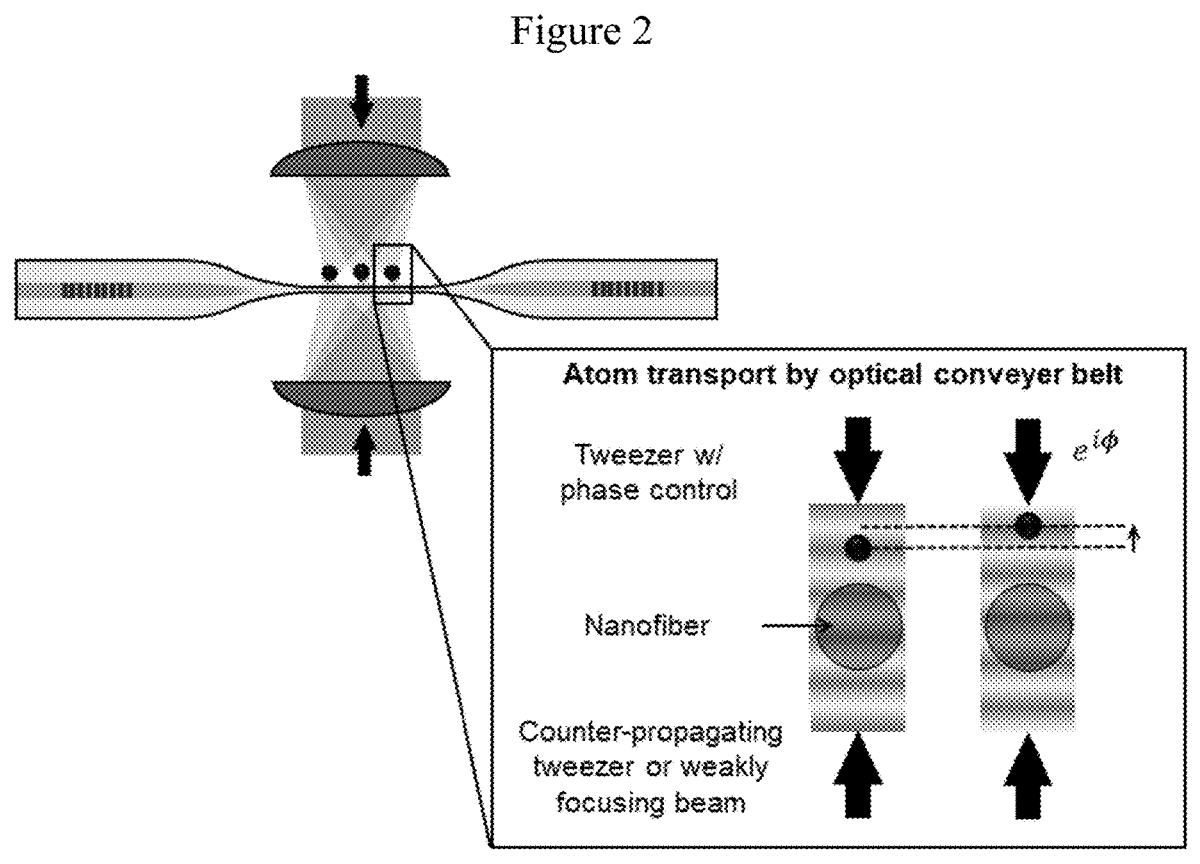

Atom transport by optical conveyer belt

Tweezer w/
phase control $e^{i\phi}$

Nanofiber

Counter-propagating
tweezer or weakly
focusing beam

Figure 4

Multiple-atom transport by an array of optical conveyer belts

All-to-all connection via cavity

Any-to-any connection via cavity

ATOM TRANSPORT FOR NANOFIBER QUANTUM COMPUTING AND REPEATER AND METHOD

BACKGROUND OF INVENTION

The present invention relates generally to quantum computing and quantum repeater techniques. In particular, the present invention provides an optical tweezer array system and method including a nanofiber region configured using an optical cable and a pair of reflectors to enable a cavity for a quantum computing device. More particularly, the invention provides techniques for transporting atoms using an optical tweezer array. Merely by way of example, the invention can be applied to a variety of applications such as secure communication, cryptography, drug discovery, optimization, machine learning and artificial intelligence, finance, weather forecasting, chemical, mechanical, electrical, civil, nuclear fusion and fission, economics, materials, and any other complex human or non-human matters.

Quantum computing is a type of computing that utilizes quantum mechanics to perform certain tasks more efficiently than classical computing. In classical computing, bits can exist in one of two states, either 0 or 1, but in quantum computing, qubits can exist in a superposition of both 0 and 1 states simultaneously. This allows quantum computers to perform certain calculations exponentially faster than classical computers, such as factorization of large numbers, optimization problems, and simulations of quantum systems.

However, both quantum computing and quantum repeater also have some drawbacks. One major challenge is that qubits are highly susceptible to noise and decoherence, which can cause errors in the computation and repeater operations. Therefore, quantum computers and repeaters require careful error mitigation and correction techniques to maintain the accuracy of the computation. Another challenge is that quantum computers are highly specialized and can only perform certain types of calculations, which limits their versatility for general-purpose computing tasks. Additionally, the physical hardware required for quantum computing is complex and expensive to build and maintain, which makes quantum computers difficult and costly to scale up. Finally, quantum algorithms are not necessarily faster for all problems, and it is unclear whether they will ever be able to replace classical computing for all applications.

From the above, it is seen that techniques for improving quantum computing and quantum repeater are desired.

SUMMARY OF INVENTION

According to the present invention, techniques generally related to quantum computing and quantum repeater are provided. In particular, the present invention provides an optical tweezer system and method including high resolution imaging system for trapping and controlling atoms and a nanofiber region configured using an optical cable and a pair of reflectors to enable a cavity for a quantum computing and repeater device. More particularly, the invention provides techniques for transporting atoms using optical tweezer arrays, which enables any-to-any connection between atoms, required for universal quantum computation. Merely by way of example, the invention can be applied to a variety of applications such as cryptography, drug discovery, optimization, machine learning and artificial intelligence, finance, weather forecasting, chemical, mechanical, electrical, civil, nuclear fusion and fission, economics, materials, and any other complex human or non-human matters.

In an example, the present invention provides a quantum computer cell system. In an example, the system has a fiber optical cable having a first end region and a second end region. The first end region has a first end, and the second end region having a second end. In an example, the system has a first fiber Bragg Grating configured on the first end region and a second fiber Bragg Grating configured on the second end region. In an example, system has a nanofiber region configured from a center portion of the fiber optic cable and coupled between the first end region and the second end region. In an example, the system has a first taper region configured from a first portion of the nanofiber region within a vicinity of the first fiber Bragg Grating and a second taper region configured from a second portion of the nanofiber region within a vicinity of the second fiber Bragg Grating. In an example, the system has a cavity formed from the nanofiber region between the first fiber Bragg Grating and the second fiber Bragg Gratings. In an example, the system has a plurality of atoms evanescently coupled at least the nanofiber region between the first fiber Bragg grating and the second fiber Bragg grating. In an example, the imaging system is configured to generate an optical tweezer array and to detect one or more photons from one or the plurality of atoms with a spatial resolution ranging from 400 nanometer and larger.

An optical tweezer system includes an optical tweezer array that is a device that uses a array of focused laser beams to trap and manipulate microscopic objects, such as atoms and molecules. In an example, a basic principle behind an optical tweezer is that the laser beam exerts a force on the object that is proportional to the gradient of the intensity of the light. In the example of manipulating atoms, an optical tweezer array typically involves multiple of laser beams that are tightly focused to a nearly diffraction-limited spot using a high numerical aperture objective lens. The laser beams are usually in the infrared or visible range and can be generated by a solid-state laser or a diode laser or other types of lasers. When the laser beams at an appropriate wavelength are focused on atoms, they create an attractive force that pulls the atom towards the center of each beam. This is known as optical trapping, or "optical tweezing." The strength of the trapping force depends on the intensity of the laser beam and the polarizability of the atom. By manipulating the position and intensity of the laser beam, we can trap atoms at a fixed distance from the nanofiber surface owing to the interference between incoming tweezer beam and its scattering from the nanofiber.

In a preferred example, the system has a counter propagating trapping tweezer array input. In an example, the system has a backside imaging system characterized by a numerical aperture of 0.05 and greater. In an example, the backside imaging system is configured to generate a counter-propagating optical tweezer array and/or a weakly focusing beam to interfere with the optical tweezer array to selectively transport at least one of the plurality of atoms that are evanescently coupled to the nanofiber region. In an example, the weakly focusing beam is not perfectly focused, although it may be focused precisely.

Depending upon the example, the present invention can achieve one or more of these benefits and/or advantages. In an example, the present invention provides any-to-any connection between atoms by cavity-mediated interactions, required for universal quantum computation. Merely by this, the present invention provides a quantum computing device using a nanofiber region configured with a pair of reflectors to form a cavity for a quantum computing and repeater. In an example, the device uses conventional optical techniques, and is compact and efficient. In an example, the present invention offers advantages of generating outputs that are reliable and efficient. In a preferred example, the present system allows for control of individual atoms one by one using the present imaging system. These and other benefits and/or advantages are achievable with the present device and related methods. Further details of these benefits and/or advantages can be found throughout the present specification and more particularly below.

BRIEF DESCRIPTION OF FIGURES

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 is a simplified diagram illustrating single-atom transport near the nanofiber according to an example of the present invention.

FIG. 4 is a simplified illustration of a method of operating an atom transport device according to an example of the present invention.

DETAILED DESCRIPTION OF THE EXAMPLES

According to the present invention, techniques generally related to quantum computing and quantum repeater are provided. In particular, the present invention provides an optical tweezer system and method including high resolution imaging system for trapping and controlling atoms and a nanofiber region configured using an optical cable and a pair of reflectors to enable a cavity for a quantum computing and repeater device. More particularly, the invention provides techniques for transporting atoms using an optical tweezer array, which enables any-to-any connection between atoms, required for a universal quantum computation. Merely by way of example, the invention can be applied to a variety of applications such as cryptography, drug discovery, optimization, machine learning and artificial intelligence, finance, weather forecasting, chemical, mechanical, electrical, civil, nuclear fusion and fission, economics, materials, and any other complex human or non-human matters.

Figure 1:
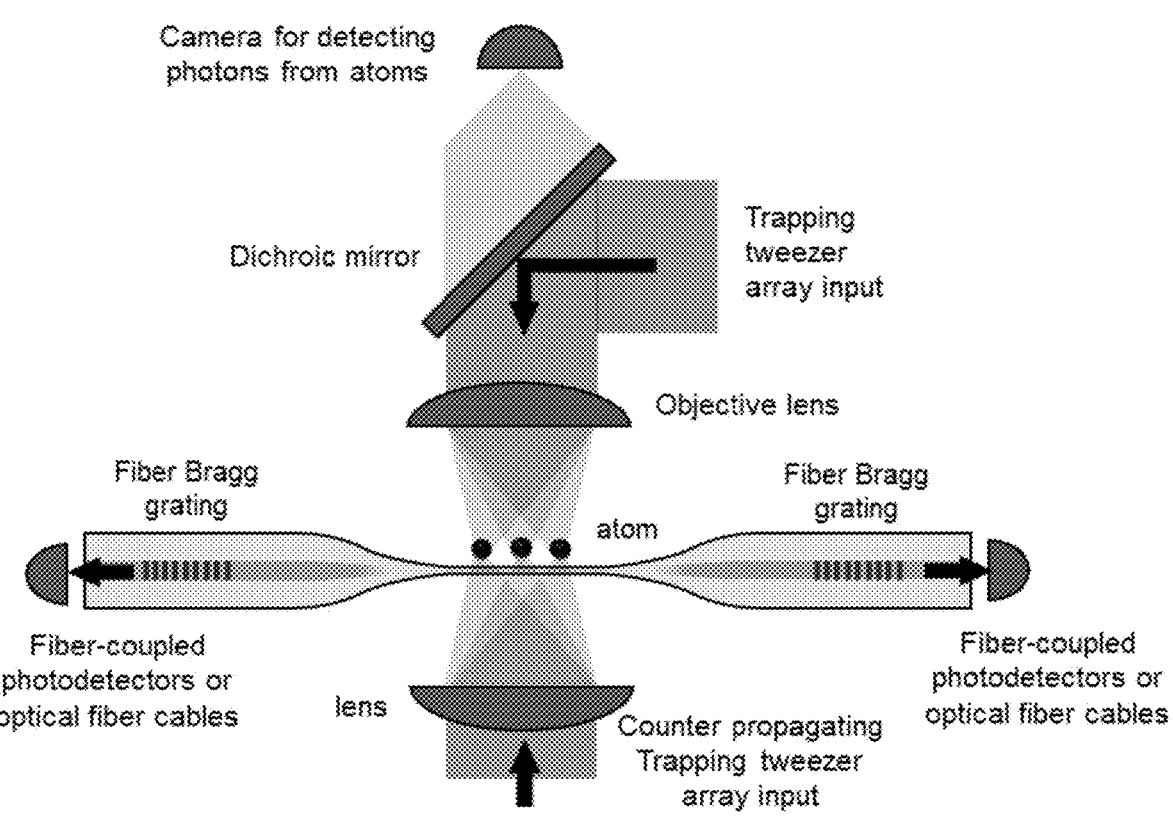
FIG. 1 is a simplified diagram illustrating quantum computing/repeater system configured with atom transport according to an example of the present invention.

FIG. 1 is a simplified diagram illustrating quantum computing/repeater system configured with atom transport according to an example of the present invention. As shown, the diagram includes a device and related system. The system has a camera (e.g., imaging system) for detecting photons from atoms, a trapping tweezer array input, a dichroic mirror, an objective lens, and a plurality of atoms.

In an example, the device includes a nanofiber region, which is thinner in diameter. A plurality of atoms is disposed slightly above the surface of the nanofiber region. In an example, the atoms are localized about 200 to 400 nanometers above the nanofiber surface for a 400 to 1000 nanometer nanofiber diameter, although there can be variations. In an example, each side of the nanofiber region is configured with a taper region that is connected to a fiber Bragg Grating structure. Each end of the fiber Bragg Grating structure is connected to the optical cable that has a photodetector device provided in a photon detection system.

In an example, the system has an imaging system. The imaging system has an image capturing device and a light source. The device also has a variety of optics including an objective lens and a dichroic mirror device configured between the image capturing device and the light source. The image capturing device includes a CMOS or charged coupled device camera including a pixel array. As shown, an imaging system is operably coupled to the nanofiber region and characterized by a numerical aperture of 0.1 and greater. In an example, the imaging system is configured to generate an optical tweezer array configured to cause trapping of the number of atoms that are evanescently coupled to at least the nanofiber region;

In an example, the system also has a controller coupled to the imaging system and light source. The controller is also coupled to a computing device, artificial intelligence engine, and image processor. The controller can be any suitable controller device including a plurality of analog-to-digital/digital-to-analog converter devices configured to interface with a computer. As shown, the controller for controlling signals from a quantum computer device is a specialized electronic system designed to interface with the quantum computing system and manipulate the signals sent and received by the device. The controller plays a crucial role in quantum computing, as it is responsible for orchestrating the complex operations required to perform quantum algorithms and measurements.

In an example, the controller typically has several components, including input/output interfaces, digital signal processing circuits, and control logic. The input/output interfaces are used to communicate with the quantum device, receiving signals from the quantum device and sending control signals to the device. These signals are typically in the form of electrical, microwave, or radio frequency signals. The digital signal processing circuits are responsible for processing the signals received from the quantum device, applying corrections for errors and noise, and performing operations such as pulse shaping and timing. This requires specialized algorithms and processing techniques that are optimized for quantum computing applications. The control logic is responsible for coordinating the operations of the controller and the quantum device, determining the appropriate sequence of operations to perform quantum algorithms and measurements. The control logic is typically implemented using a combination of software and hardware, including field-programmable gate arrays (FPGAs) and custom application specific integrated circuits (ASICs).

In a preferred example, the system includes an optical tweezer that is a device that uses a focused laser beam to trap and manipulate microscopic objects, such as atoms and molecules. In an example, a basic principle behind an optical tweezer is that the laser beam exerts a force on the object that is proportional to the gradient of the intensity of the light. In the example of manipulating atoms, an optical tweezer typically involves a laser beam that is tightly focused to a diffraction-limited spot using a high numerical aperture objective lens. The laser beam is usually in the infrared or visible range and can be generated by a solid-state laser or a diode laser or other types of lasers. When the laser beam at an appropriate wavelength is focused on an atom, it creates an attractive force that pulls the atom towards the center of the beam. This is known as optical trapping, or "optical tweezing." The strength of the trapping force depends on the intensity of the laser beam and the polarizability of the atom. By manipulating the position and intensity of the laser beam, we can trap atoms at a fixed distance from the nanofiber surface owing to the interference between incoming tweezer beam and its scattering from the nanofiber.

In an example, the system has a plurality of atoms comprising an alkali metal atom including a cesium and a rubidium, an alkaline-earth metal and an alkaline-earth-like atom and other laser coolable atoms including an ytterbium or a strontium and other laser-coolable atoms. In an example, a number of the atoms range from one to 100,000 and are evanescently coupled to the nanofiber region.

In an example, the system has an imaging system characterized by a numerical aperture of 0.1 and greater, although there can be variations. In an example, the imaging system is configured to generate an optical tweezer array and to detect one or more photons from one or the plurality of atoms with a spatial resolution ranging from 400 nanometer and larger.

In an example, the laser tweezer array is a setup that utilizes multiple focused laser beams to manipulate and trap microscopic, atoms, particles, or cells in a controlled manner. The array includes a controlling tweezer array and a trapping tweezer array.

In an example, the controlling tweezer array consists of an arrangement of laser beams that are used to precisely position and control the movement of the trapped atoms. Each beam in the controlling array can be individually controlled, allowing for complex manipulation of multiple atoms simultaneously. The controlling beams are typically weaker than the trapping beams and are used to exert forces on the atoms without fully immobilizing them.

In an example, the controlling beams are focused on the atoms using lenses or mirrors, creating attractive or repulsive forces depending on the setup. By adjusting the intensity and direction of the controlling beams, the atoms can be manipulated along desired paths or brought into proximity with other atoms.

In an example, the trapping tweezer array is composed of laser beams that create highly focused and intense optical traps to capture and hold the atoms. These traps are created using a technique called optical trapping or optical tweezing, where the atoms experience a gradient force that pulls them towards the high-intensity region of the laser beam. In an example, the trapping beams are typically formed using high numerical aperture lenses to achieve a tight focal spot. The atoms are trapped at the beam's focus, where the intensity is highest. The intensity distribution of the trapping beams can be shaped to create multiple traps at different positions within the array.

In an example, the trapping tweezer array allows for stable confinement of particles in three dimensions, enabling the study of atom or particle dynamics, cell manipulation, or assembly of complex structures.

In an example, the controlling and trapping tweezer arrays work in conjunction to enable precise control and manipulation of the trapped atoms. The controlling beams can adjust the position, speed, and direction of the atoms, while the trapping beams provide a stable confinement.

By dynamically adjusting the intensity and positions of the laser beams in both arrays, various manipulation techniques can be employed. These include moving atoms along specific paths, sorting atoms based on their properties, arranging atoms into desired patterns, or bringing particles into contact for controlled interactions.

In an example, each end of the optical cable includes a fiber coupled photodetector.

In a preferred example, the system has a counter propagating trapping tweezer array input. In an example, the system has a backside imaging system characterized by a numerical aperture of 0.05 and greater. In an example, the backside imaging system is configured to generate a counter-propagating optical tweezer array and/or a weakly focusing beam to interfere with the optical tweezer array to selectively transport at least one of the plurality of atoms that are evanescently coupled to the nanofiber region.

In an example the selectively transport moves the one atom by a spatial distance from below 100 nm to 10 microns along a direction of the optical tweezer array. In an example, the selectively transport moves the one atom by a spatial distance from below 100 nm to 10 microns along a direction of the optical tweezer array to a predetermined spatial region.

In an example, the imaging system comprises a first laser light source and the backside imaging system comprises a second laser light source, each of the first laser light source is characterized by a same wavelength. In an example, the imaging system comprises a first laser light source and the backside imaging system comprises a second laser light source. Each of the first laser light source and the second laser light source is characterized by a same wavelength. A phase of the second laser light source is changed to initiate the selective transport of the one of the plurality of atoms.

In an example, the imaging system comprises a first laser light source and the backside imaging system comprises a second laser light source. Each of the first laser light source and the second light source is characterized by a same wavelength and is characterized by a phase. A phase of the second laser light source is changed to initiate the selective transport of the one of the plurality of atoms.

In an example, as shown, the optical tweezer array from the imaging system is propagating in a first direction and the counter propagating optical tweezer array is propagating in a second direction such that the first direction is opposite of the second direction. The counter propagating optical tweezer array counters the optical tweezer array from the imaging system. As used herein, the term opposite means nearly opposite or has a component that is opposite and does not literally mean 180 degrees from each other, but can include variations, which cause each of the beams to counter act each other.

In an example, the backside illumination system comprises an optical lens coupled to a laser light source. In an example, the backside illumination system comprises a plurality of lenses coupled to a laser light source configured to generate the counter propagating optical tweezer array. In an example, the backside illumination comprises multiple lenses coupled to a laser light source configured to emit the counter propagating optical tweezer array such that a propagating direction of the counter propagating optical tweezer array is opposite of a direction of the optical tweezer array.

In an example, the optical tweezer array is characterized by a first intensity and the counter propagating optical tweezer array is characterized by a second intensity. The first intensity is controlled independent of the second intensity using a modulator device, e.g., acousto-optic modulator, electro-optic modulator, and others. The first intensity and/or the second intensity is maintained at a predetermined value during the selective transport to maintain the first intensity and the second intensity at a spatial location of one or more trapped atoms.

In an example, the optical tweezer array is characterized by a first phase and the counter propagating optical tweezer array is characterized by a second phase. Each of the first phase and the second phase is independently controlled using a modulator device. In an example, the modulator device includes at least one of an acousto-optic modulator or deflector, an electro-optic modulator, or a phase modulator.

In an example, the optical tweezer array is characterized by a first phase and the counter propagating optical tweezer array is characterized by a second phase. The first phase and the second phase are characterized by a phase difference such phase difference is detected by an intensity of scattered light at the nanofiber region using an imaging system and/or detecting a coupled light into the nanofiber by using a photodetector at one or both ends of the optical fiber cable. The phase difference characterizes a drift associated with a temperature, an air current, or an environmental drift and such drift is corrected using a phase shifter as an example.

Further details of the examples can be found throughout the present specification and more particularly below.

FIG. 2 is a simplified diagram illustrating single-atom transport near the nanofiber according to an example of the present invention. As shown are an optical tweezer array and counterpropagating tweezer array to form the interference pattern where the fringe of the interference can be controlled by changing the phase difference between optical tweezer array and counterpropagating tweezer array. The atom trapped near the surface is transported away from the surface by adiabatically change the phase difference where the rate of change in phase needs to be slower than the atomic motion such that the location of atom follows the intensity maximum of the interference.

Figure 3:
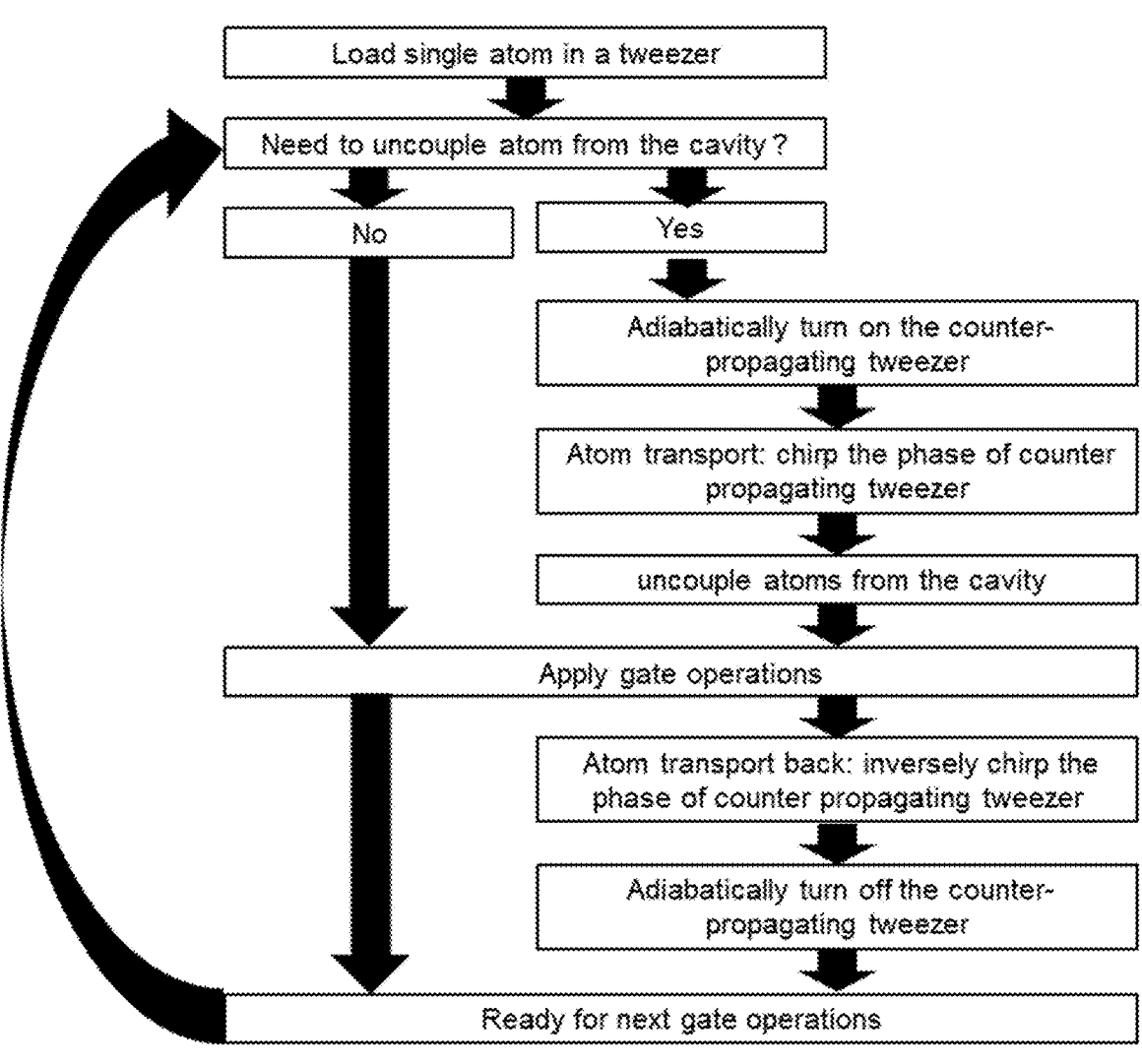
FIG. 3 is a simplified diagram illustrating individual transport of atom array according to an example of present invention.

FIG. 3 is a simplified diagram illustrating individual transport of atom array according to an example of present invention. As shown, a method loads an atom (e.g., single or group) in a tweezer or tweezer array. The method decides whether the atom is uncoupled from a cavity region of the quantum computer system. If no, the method applies gate operations, and returns. If yes, the method adiabatically turns on the counter propagating tweezer, performs transport of the atom(s) using a chirp of phase of the counter propagating tweezer, and then uncouples the atom(s) from the cavity region. Next, the method applies gate operations, that is, transports the atoms back to the cavity using an inverse chirp to the phase of the counter propagating tweezer, and adiabatically turns off the counter propagating tweezer, and is then ready for the next gate operation. Further details of the method are provided throughout the present specification and more particularly below.

In particular, a technique for manipulating an atom within a quantum computing system is described as follows:

The system utilizes a fiber optic cable with distinct end regions (first and second), wherein the first end region has a terminating end and the second end region has another terminating end. The fiber optic cable comprises silicon dioxide material with a core region encompassed by a cladding region. Furthermore, a nanofiber region is configured from the central section of the fiber optic cable, coupled between the first and second end regions.

Next, the method includes loading a group of atoms, which includes laser coolable atoms, into the system and in particular the nanofiber region. The laser coolable atoms encompass one or more of the following: an alkali metal atom, an alkaline-earth metal, or an alkaline-earth-like atom.

The quantity of atoms ranges from one to 100,000. These atoms are evanescently connected to the nanofiber region through an optical tweezer array created by a first imaging system.

In an example, the method generates a counter-propagating optical tweezer array and/or a weakly focusing beam using a second imaging system. This interferes with the optical tweezer array mentioned earlier, allowing selective transportation of at least one of the evanescently coupled atoms within the nanofiber region. Further details of the aforementioned technique can be found throughout the present specification and more particularly below.

In an example, the selectively transport moves the one atom or more atoms by a spatial distance from below 100 nm to 10 microns along a direction of the optical tweezer array to a predetermined spatial region.

In an example, the first imaging system comprises a first laser light source and wherein second imaging system comprises a second laser light source. Each of the first laser light source and the second light source is characterized by a same wavelength. In an example, a phase of the second laser light source is changed to initiate the selective transport of the one of the plurality of atoms.

In an example, the first imaging system comprises a first laser light source and second imaging system comprises a second laser light source. Each of the first laser light source and the second light source is characterized by a same wavelength and is characterized by a phase. A phase of the second laser light source is adiabatically changed to initiate the selective transport of the one of the plurality of atoms.

In an example, the optical tweezers from the first imaging system is propagating in a first direction and the counter propagating optical tweezer array is propagating in a second direction such that the first direction is opposite of the second direction.

In an example, the second illumination system comprises an optical lens coupled to a laser light source. In an example, the second illumination system comprises a plurality of lenses coupled to a laser light source configured to emit the counter propagating optical tweezer array. In an example, the second illumination system comprises multiple lenses coupled to a laser light source configured to emit the counter propagating optical tweezer array such that a propagating direction of the counter propagating optical tweezer array is opposite of a direction of the optical tweezer array.

In an example, the selectively transport of at least one of the plurality of atoms that are evanescently coupled to the nanofiber region includes a group of the plurality of atoms. The group is N atoms and greater, where N is 2 or more, to decouple the group of the plurality of atoms from the remaining plurality of atoms that are evanescently coupled to the nanofiber region.

In an example, the selectively transport of at least one of the plurality of atoms enables to engineer or create any-to-any connections between any pair of atoms through a cavity-mediated interaction. The any-to-any connections enables quantum computing and quantum repeater characterized by entanglement swapping and purification.

In an example, the selectively transport moves the one atom or more atoms by a spatial distance from below 100 nm to 10 microns along a direction of the optical tweezer array to a predetermined spatial region by changing a phase difference between optical tweezer array and counter propagating tweezer array or weakly focusing beams. In an example, wherein the selectively transport of at least one of the plurality of atoms that are evanescently coupled to the nanofiber region includes a group of the plurality of atoms, whereupon the group is N and greater, where N is 2 or more, to decouple one atom or the group of the plurality of atoms from the remaining plurality of atoms that are evanescently coupled to the nanofiber region.

In an example, the selectively transport of at least one of the plurality of atoms enables cause any-to-any connections between any pair of atoms through a cavity-mediated interaction; whereupon the any-to-any connections enables a universal quantum computing and quantum repeater characterized by an entanglement swapping and a purification.

Entanglement swapping and purification are concepts in the field of quantum computing and quantum communication that involve manipulating and improving the quality of entangled states.

In an example, entanglement swapping is a process that allows the entanglement of two atoms, which have never directly interacted with each other, to be transferred or "swapped" onto a different pair of atoms. The key idea behind entanglement swapping is the phenomenon of quantum entanglement, where the states of two or more atoms become correlated in a way that the properties of one particle are instantaneously related to the properties of another, regardless of the distance between them.

The entanglement swapping process typically involves four atoms, referred to as A, B, C, and D. Initially, atoms A and B are entangled, and atoms C and D are also entangled. However, atoms A and D have never interacted or shared entanglement. Through a series of implementations of logic gates and measurements performed on atoms B and C, their entanglement is effectively transferred or swapped onto atoms A and D. As a result, atoms A and D become entangled even though they have never directly interacted.

Entanglement swapping is a useful tool in quantum communication protocols, as it enables the distribution of entanglement between distant parties, even in the presence of noisy or lossy channels. It plays a role in quantum teleportation and long-distance quantum key distribution.

In an example, entanglement purification is a technique used to enhance the quality of entangled states by removing unwanted noise and errors that may have affected the initial entangled pair. In quantum systems, interactions with the environment can cause decoherence and introduce errors, which can degrade the quality of entanglement.

The basic idea behind entanglement purification is to employ logic gates and local quantum operations and classical communication between two or more parties who share a partially entangled state. By performing measurements on the shared entangled states and exchanging classical information, it is possible to identify and discard the parts of the state that are highly corrupted or contain errors. The remaining purified entangled pairs exhibit higher fidelity and can be used for more reliable quantum computations or communication protocols.

Entanglement purification protocols typically involve iterative steps, where the initial entangled pairs are subjected to measurements, followed by classical communication to update the purification criteria and perform subsequent rounds of purification. Various protocols and strategies exist for entanglement purification, each tailored to specific requirements and assumptions about the nature of noise and errors.

Entanglement purification is used in quantum cryptography and quantum error correction, as it allows for the creation of high-quality entangled states necessary for secure communication and reliable quantum information processing.

Both entanglement swapping and entanglement purification are techniques in the field of quantum computing and quantum communication. They enable the manipulation and improvement of entangled states, which are fundamental resources for various quantum protocols and applications.

In an alternative example, the present invention provides a method for manipulating an atom in a quantum computing and quantum repeater system comprises the following steps:

In an example, the method involves using a fiber optical cable that has a first end region and a second end region. The first end region has a first end, and the second end region has a second end. The fiber optical cable is made of silicon dioxide material and consists of a core region and a cladding region surrounding the core region. Additionally, there is a nanofiber region present, which is located in the center portion of the fiber optic cable and is coupled between the first end region and the second end region.

In an example, multiple atoms, including laser coolable atoms such as alkali metal atoms, alkaline-earth metals, or alkaline-earth-like atoms, are loaded into the system. The number of atoms can range from one to 100,000. These laser coolable atoms are evanescently coupled to the nanofiber region using an optical tweezer array that is generated from a first imaging system.

In an example, a counter-propagating optical tweezer array and/or a weakly focusing beam are generated using a second imaging system. These beams interfere with the optical tweezer array, allowing for selective transportation of at least one of the plurality of atoms that are evanescently coupled to the nanofiber region.

In an example, an any-to-any connection is established between any pair of atoms through a cavity mediated interaction. This connection is facilitated by utilizing the selectively transported atom(s) from the previous step.

In summary, the method involves utilizing a fiber optical cable, loading laser coolable atoms, selectively transporting atoms using optical tweezers, and establishing connections between atoms through cavity mediated interactions. These steps form the basis for manipulating atoms within a quantum computing system.

Figure 4:
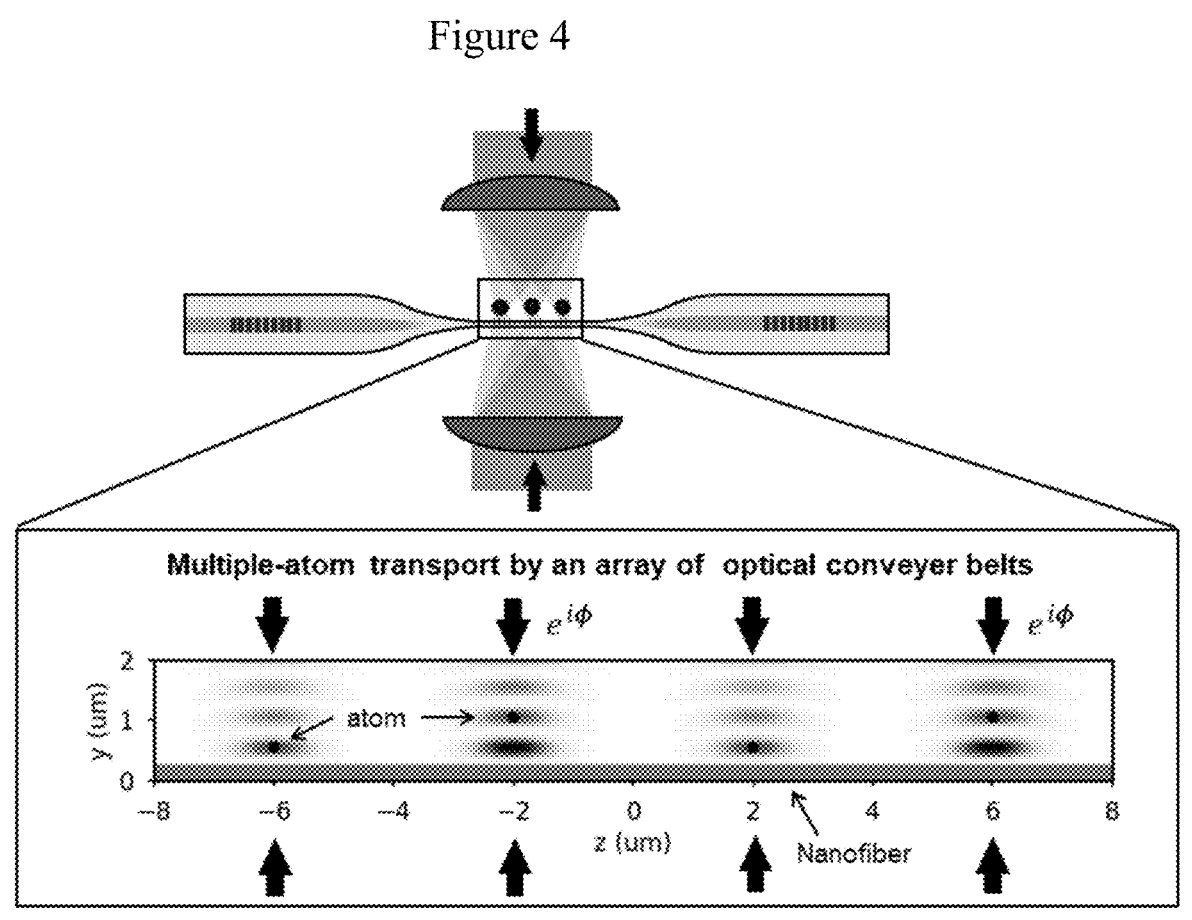

FIG. 4 is a simplified illustration of a method of operating multiple-atom transport device according to an example of the present invention. In an example, a second and fourth atoms are transported near the surface to 1 μm from the surface by changing the phase difference between each pair of forward propagating and counter-propagating tweezer beams. The tightly-focused tweezer array close to the diffraction limit show no cross-talk to the neighboring atoms such that the first and third atoms are localized at the initial locations while other two atoms are transported, demonstrating the selective transport among N atoms where N is large than 2. Further details are explained below.

Figure 5:
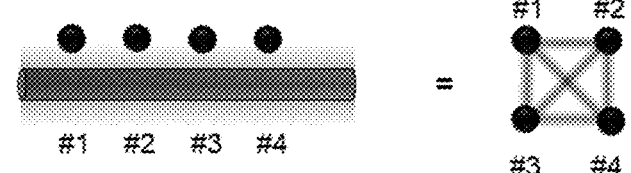
FIG. 5 is a simplified diagram illustrating control of connectivity by atom transport according to an example of the present invention.
Figure 5:
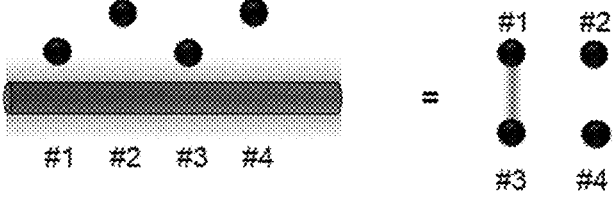

FIG. 5 is a simplified diagram illustrating control of connectivity by atom transport according to an example of the present invention. As shown, the top figure describes the all-to-all connection where all the atoms are coupled to the cavity and interact each other equally. This type of connection facilitates the parallel logic gate operation for all the atoms, but often not sufficient for the universal quantum computation. The present invention provides the any-to-any connection where any pair of atoms can be remained coupled to the cavity and interact each other while the rest of the atoms are transported far enough to be decoupled from the cavity as shown in the bottom figure. This any-to-any connection is required for universal quantum computation and efficient encoding of quantum algorithm.

In an example, as used herein, universal quantum computing refers to a theoretical framework and set of principles that enable the development and utilization of quantum computers capable of solving a wide range of computational problems. Unlike classical computers, which operate using bits that represent either a 0 or a 1, quantum computers use quantum bits or qubits, which can exist in a superposition of states representing both 0 and 1 simultaneously. This superposition allows quantum computers to perform parallel computations and potentially solve certain problems much faster than classical computers.

In universal quantum computing, the basic building blocks are quantum gates, which are analogous to the logic gates in classical computing. Quantum gates manipulate the qubits to perform quantum operations such as superposition and entanglement. Superposition allows qubits to exist in a combination of states, entanglement creates correlations between qubits, and measurement provides the output of the computation.

The power of universal quantum computing lies in the ability to combine these quantum gates to create quantum circuits that can perform complex computations. Quantum algorithms, such as Shor's algorithm for factorization and Grover's algorithm for searching, have demonstrated potential for exponential speedup over classical algorithms for specific problems. This speedup is particularly relevant for areas such as cryptography, optimization, and simulation.

Implementing universal quantum computing is a significant technological challenge due to the delicate nature of qubits and the susceptibility of quantum systems to environmental noise and decoherence. Various physical systems are being explored for qubit implementation, including superconducting circuits, trapped ions, topological qubits, and others. These qubits are typically operated at extremely low temperatures, close to absolute zero, to minimize decoherence effects. Universal quantum computing holds the promise of revolutionizing fields such as cryptography, drug discovery, optimization, and materials science.

While the above is a full description of the specific examples, various modifications, alternative constructions, and equivalents may be used. As an example, the device can include any combination of elements described above, as well as outside of the present specification. Additionally, the terms first, second, third. and final do not imply order in one or more of the present examples. As used herein, the term "backside" and/or "frontside" does not mean any specific placement but are merely used in reference to other elements in the claim. Therefore, the above description and illustrations should not be taken as limiting the scope of the present invention which is defined by the appended claims.

The invention claimed is:

1. A quantum computer cell system or a quantum repeater system, the system comprising:

a fiber optical cable having a first end region and a second end region, the first end region having a first end, and the second end region having a second end, the fiber optical cable comprising silicon dioxide material comprising a core region and a cladding region configured around the core region;

a first fiber Bragg Grating configured on the first end region;

a second fiber Bragg Grating configured on the second end region;

a nanofiber region configured from a center portion of the fiber optic cable and coupled between the first end region and the second end region, the nanofiber region having a transmission of 95% and greater, the nanofiber region having a diameter ranging from 300 nanometer to 1.5 micrometer, the nanofiber region ranging from 10 micrometer to 10 centimeter in length;

a first taper region configured from a first portion of the nanofiber region within a vicinity of the first fiber Bragg Grating;

a second taper region configured from a second portion of the nanofiber region within a vicinity of the second fiber Bragg Grating;

a cavity formed from the nanofiber region between the first fiber Bragg Grating and the second fiber Bragg Gratings;

a plurality of atoms comprising at least one or more of an alkali metal atom, an alkaline-earth metal, a cesium, a rubidium, ytterbium, and strontium, such that a number of the atoms range from one to 100,000 are evanescently coupled at least the nanofiber region between the first fiber Bragg grating and the second fiber Bragg grating;

an imaging system operably coupled to the nanofiber region and characterized by a numerical aperture of 0.1 and greater, the imaging system configured with a first laser source to generate an optical tweezer array configured to cause trapping of the number of atoms that are evanescently coupled to at least the nanofiber region;

a backside imaging system characterized by a numerical aperture of 0.05 and greater, the backside imaging system configured with a second laser source to generate a counter-propagating optical tweezer array and/or a weakly focusing beam to interfere with the optical tweezer array to selectively transport at least one of the plurality of atoms that are evanescently coupled to the nanofiber region.

2. The system of claim 1 wherein the selectively transport moves the one or more of the plurality of atoms by a spatial distance from below 100 nm to 10 microns along a direction of the optical tweezer array to a predetermined spatial region.

3. The system of claim 1 wherein each of the first laser light source and the second light source is characterized by a same wavelength.

4. The system of claim 1 wherein each of the first laser light source and the second light source is characterized by a same wavelength; and whereupon a phase of either the first or the second laser light source is changed to initiate the selective transport of the one atom or the plurality of atoms.

5. The system of claim 1 wherein the optical tweezer array from the imaging system is propagating in a first direction; and the counter propagating optical tweezer array or weakly focusing beam is propagating in a second direction such that the first direction is opposing the second direction.

6. The system of claim 1 wherein the backside imaging system comprises multiple lenses coupled to a laser light source configured to generate the counter propagating optical tweezer array or a weakly focusing beam such that a propagating direction of the counter propagating optical tweezer array is opposite or nearly opposite of a direction of the optical tweezer array.

7. The system of claim 1 wherein the optical tweezer array is characterized by a first intensity and the counter propagating optical tweezer array is characterized by a second intensity such that the first intensity is controlled independent of the second intensity using a modulator device such that the first intensity and/or the second intensity is maintained at a predetermined value during the selective transport to maintain the same trap frequencies at a spatial location of one or more trapped atoms, the modulator device includes at least one of an acousto-optic modulator, a deflector, an electro-optic modulator, or another phase modulator.

8. The system of claim 1 wherein the optical tweezer array is characterized by a first phase and the counter propagating optical tweezer array is characterized by a second phase, each of the first phase and the second phase is independently controlled using a modulator device, the modulator device includes at least one of an acousto-optic modulator, a deflector, an electro-optic modulator, or another phase modulator.

9. The system of claim 1 wherein the optical tweezer array is characterized by a first phase and the counter propagating optical tweezer array is characterized by a second phase, the first phase and the second phase are characterized by a phase difference such phase difference is detected by an intensity of scattered light at the nanofiber region using the imaging system and/or detecting a coupled light into the nanofiber by using a photodetector at one or each ends of the optical fiber cable.

10. The system of claim 9 wherein the drift of a phase difference is caused by a temperature change, an air current, or other types of environmental changes and such differential phase drift is monitored by the combination of scattered light of the optical tweezer array into the fiber and reflected light of the optical tweezer array from the nanofiber region and is corrected using a phase shifter.

\*　\*　\*　\*　\*